(12) United States Patent
Ishida et al.

(10) Patent No.: US 10,159,120 B2
(45) Date of Patent: Dec. 18, 2018

(54) EL DISPLAY DEVICE AND METHOD FOR MANUFACTURING EL DISPLAY DEVICE

(71) Applicant: Sharp Kabushiki Kaisha, Sakai, Osaka (JP)

(72) Inventors: Mamoru Ishida, Sakai (JP); Tetsuya Okamoto, Sakai (JP); Takeshi Hirase, Sakai (JP); Tohru Senoo, Sakai (JP); Tohru Sonoda, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/579,294

(22) PCT Filed: Jun. 7, 2016

(86) PCT No.: PCT/JP2016/066829
§ 371 (c)(1),
(2) Date: Dec. 4, 2017

(87) PCT Pub. No.: WO2016/199739
PCT Pub. Date: Dec. 15, 2016

(65) Prior Publication Data
US 2018/0153006 A1    May 31, 2018

(30) Foreign Application Priority Data

Jun. 12, 2015    (JP) .................................. 2015-119593

(51) Int. Cl.
*H05B 33/04* (2006.01)
*H05B 33/10* (2006.01)
(Continued)

(52) U.S. Cl.
CPC ............... *H05B 33/04* (2013.01); *G09F 9/30* (2013.01); *H01L 27/32* (2013.01); *H01L 51/50* (2013.01);
(Continued)

(58) Field of Classification Search
CPC . H01L 51/5253–51/5259; H05B 33/04; H05B 33/10
See application file for complete search history.

(56) References Cited

U.S. PATENT DOCUMENTS

| 2004/0041147 A1* | 3/2004 | Park | H01L 51/5256 257/40 |
| 2007/0248808 A1* | 10/2007 | Lee | H01L 51/524 428/319.1 |

(Continued)

FOREIGN PATENT DOCUMENTS

| JP | 2004-63304 A | 2/2004 |
| JP | 2004-95551 A | 3/2004 |

(Continued)

OTHER PUBLICATIONS

Official Communication issued in International Patent Application No. PCT/JP2016/066829, dated Aug. 2, 2016.

*Primary Examiner* — Mariceli Santiago
(74) *Attorney, Agent, or Firm* — Keating & Bennett, LLP

(57) ABSTRACT

An EL display device in which the adhesion between a substrate and a sealing film is increased and in which the occurrence of cracks in the sealing film is reduced is provided. A lower inorganic film (31) has a multilayer structure including a first inorganic layer (34), which is in contact with the substrate and an EL element, and a second inorganic layer (35). The absolute value of the film stress of the first inorganic layer (34) is less than the absolute value of the film stress of the second inorganic layer (35), and the film thickness of the first inorganic layer (34) is less than the film thickness of the second inorganic layer (35).

14 Claims, 8 Drawing Sheets

(51) Int. Cl.
  *H01L 51/52*  (2006.01)
  *G09F 9/30*  (2006.01)
  *H01L 51/50*  (2006.01)
  *H01L 27/32*  (2006.01)
  *G09F 9/302*  (2006.01)

(52) U.S. Cl.
  CPC ...... *H01L 51/5012* (2013.01); *H01L 51/5203* (2013.01); *H01L 51/5246* (2013.01); *H05B 33/10* (2013.01); *G09F 9/301* (2013.01); *G09F 9/302* (2013.01); *H05K 999/99* (2013.01)

(56) References Cited

U.S. PATENT DOCUMENTS

| | | | | |
|---|---|---|---|---|
| 2008/0164808 | A1* | 7/2008 | Kim | H01L 51/5256 313/504 |
| 2010/0051973 | A1* | 3/2010 | Kobayashi | H01L 51/5092 257/88 |
| 2010/0201261 | A1* | 8/2010 | Kwack | H01L 51/5237 313/504 |
| 2011/0175137 | A1* | 7/2011 | Utumi | H01L 51/524 257/100 |
| 2014/0117330 | A1 | 5/2014 | Cho et al. | |
| 2014/0319997 | A1* | 10/2014 | Lee | H05B 33/04 313/504 |
| 2016/0308165 | A1 | 10/2016 | Mihara et al. | |

FOREIGN PATENT DOCUMENTS

| | | |
|---|---|---|
| JP | 2005-222778 A | 8/2005 |
| JP | 4196440 B2 | 12/2008 |
| JP | 5448960 B2 | 3/2014 |
| JP | 2014-86415 A | 5/2014 |
| JP | 2015-125955 A | 7/2015 |

* cited by examiner (a)

| SAMPLE | FILM STRESS [Mpa] (COMPRESSIVE STRESS) | FILM THICKNESS [nm] | ELONGATION AT BREAK [%] |
|---|---|---|---|
| 1 | −51 | 500 | 1.31 |
| 2 | −51 | 300 | 1.36 |
| 3 | −51 | 200 | 1.59 |
| 4 | −51 | 150 | 1.81 |
| 5 | −51 | 100 | 1.83 |
| 6 | −222 | 500 | 1.64 |
| 7 | −222 | 300 | 1.85 |
| 8 | −222 | 150 | 2.05 |

| SAMPLE | NUMBER OF LAYERS | FILM THICKNESS [nm] | COMPRESSIVE STRESS | Ca RESIDUAL RATE AT 80°C85%220h [%] |
|---|---|---|---|---|
| 1 | 3 | 100/300/100 | LOW/HIGH/LOW | 70.2 |
| 2 | 3 | 200/100/200 | HIGH/LOW/HIGH | 78.9 |
| 3 | 5 | 100 × 5 | HIGH/LOW... | 74.8 |
| 4 | 9 | 55 × 9 | HIGH/LOW... | 60.6 |

EL DISPLAY DEVICE AND METHOD FOR MANUFACTURING EL DISPLAY DEVICE

TECHNICAL FIELD

The present invention relates to an EL display device and a method for manufacturing the EL display device.

BACKGROUND ART

EL display devices, which use a light emitting material that exhibits electroluminescence (hereinafter abbreviated as "EL"), have been attracting attention as display devices having a higher response speed and wider viewing angle than liquid crystal display devices.

An EL display device includes, for example, a TFT substrate, which is obtained by forming thin film transistors (TFTs) on a base made of a glass substrate or the like, and an EL element provided on the TFT substrate so as to be connected to the TFTs.

However, the EL element is generally easily affected by moisture, oxygen, etc., and reaction with a small amount of moisture or oxygen causes deterioration in their characteristics and reduction in lifespan of the display device.

Accordingly, a technology for preventing moisture and oxygen from entering the EL element by, for example, forming a sealing film on the EL element so as to seal the EL element has been known.

The sealing film may be formed by, for example, vapor deposition. The thicker the sealing film, the greater the blocking effect for preventing moisture and oxygen from entering the EL element. However, when the film thickness of the sealing film is increased, the film stress of the sealing film increases, and there is a risk of film separation, that is, a risk that the sealing film will be separated from the TFT substrate. There is also a risk that cracks will be formed in the sealing film when an external force is applied to the EL display device.

When the separation of the sealing film occurs or when cracks are formed in the sealing film, moisture, oxygen, etc., may enter the EL element through the separated or cracked portion and cause a light emission failure that causes, for example, dark spots or shrinkage.

PTL 1 describes a light emitting device in which an inorganic insulating film, which is provided on an organic EL element and serves as a sealing film, a stress absorbing film containing an organic compound, and an inorganic insulating film are arranged in that order. In the light emitting device described in PTL 1, the stress absorbing film, which has a stress less than those of the two inorganic insulating films, is disposed between the inorganic insulating films. Accordingly, the film stresses of the inorganic insulating films are absorbed, and separation of the inorganic insulating films is prevented.

PTL 2 discloses a gas barrier film including a SiOx thin film formed on a base film. A compressive residual strain is applied to the thin film to increase the breaking strain of the SiOx thin film and reduce the occurrence of cracks.

PTL 3 describes an organic EL display device in which a buffer layer is provided on a resin film, and in which TFTs, an organic EL element, and a sealing film are formed on the buffer layer in that order by, for example, vacuum deposition. The buffer layer of the organic EL display device according to PTL 3 has a multilayer structure in which a compressive stress layer composed of an inorganic film, a tensile stress layer, and a compressive stress layer are stacked in that order. The compressive stress layers and the tensile stress layer cancel each other's stresses, and thereby reduce the occurrence of cracks in the TFTs.

CITATION LIST

Patent Literature

PTL 1: Japanese Unexamined Patent Application Publication No. 2004-95551 (published Mar. 25, 2004)
PTL 2: Japanese Patent No. 4196440 (registered Oct. 10, 2008)
PTL 3: Japanese Patent No. 5448960 (registered Jan. 10, 2014)

SUMMARY OF INVENTION

Technical Problem

In the light emitting device according to PTL 1, as the thickness of the inorganic insulating film provided on the EL element increases, the moisture resistance increases so that moisture can be more reliably prevented from entering the EL element. However, when the thickness of the inorganic insulating film is increased, the adhesion between the inorganic insulating film and the EL element is reduced due to the influence of the compressive stress of the inorganic insulating film. The light emitting device according to PTL 1 is not capable of increasing the moisture resistance and the adhesion of the inorganic insulating film at the same time.

In the gas barrier film according to PTL 2, the adhesion between the SiOx thin film and the base film is not taken into consideration. Therefore, when the technology described in PTL 2 is used to form the sealing film of the EL display device, there is a risk that the adhesion between the sealing film and the TFT substrate will be reduced and the sealing film will be separated from the TFT substrate.

In the organic EL display device according to PTL 3, the adhesion between the buffer layer and the resin film is not taken into consideration. Therefore, when the technology described in PTL 3 is used to form the sealing film of the EL display device, there is a risk that the adhesion between the sealing film and the TFT substrate will be reduced and the sealing film will be separated from the TFT substrate.

The present invention has been made in light of the above-described problems, and its object is to provide an EL display device in which the adhesion between a substrate and a sealing film is increased and in which the occurrence of cracks in the sealing film is reduced, and to provide a method for manufacturing the EL display device.

Solution to Problem

To solve the above-described problem, an EL display device according to an aspect of the present invention includes an EL element formed on a substrate and a sealing film formed on the substrate and the EL element so as to seal the EL element between the sealing film and the substrate. The sealing film includes a first inorganic film. The first inorganic film has a multilayer structure including a first layer and a second layer, the first layer being in contact with the substrate and the EL element, the second layer being formed on the first layer. An absolute value of a film stress of the first layer is less than an absolute value of a film stress of the second layer, and a film thickness of the first layer is less than a film thickness of the second layer.

Also, to solve the above-described problem, a method for manufacturing an EL display device according to an aspect of the present invention, which is a method for manufacturing an EL display device including an EL element formed on a substrate and a sealing film formed on the substrate and the EL element so as to seal the EL element between the sealing film and the substrate, the sealing film including a first inorganic film, includes forming the first inorganic film. The first inorganic film has a multilayer structure including a first layer and a second layer. The first layer is in contact with the substrate and the EL element. The second layer is formed on the first layer. In the forming, the first inorganic film is formed so that an absolute value of a film stress of the first layer is less than an absolute value of a film stress of the second layer, and that a film thickness of the first layer is less than a film thickness of the second layer.

Advantageous Effects of Invention

According to an aspect of the present invention, an EL display device in which the adhesion between a substrate and a sealing film is increased and in which the occurrence of cracks in the sealing film is reduced, and a method for manufacturing the EL display device can be provided.

DESCRIPTION OF EMBODIMENTS

First Embodiment

Figure 1:
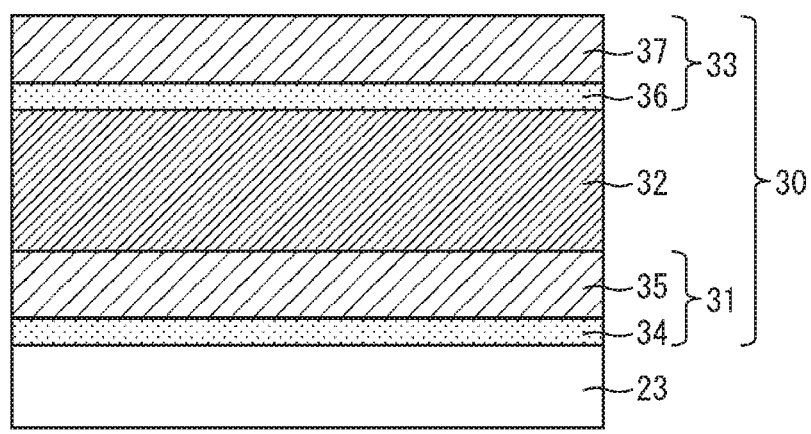
FIG. 1 is a sectional view illustrating the structure of a second electrode and a sealing film included in an organic EL display device according to a first embodiment of the present invention.
Figure 2:
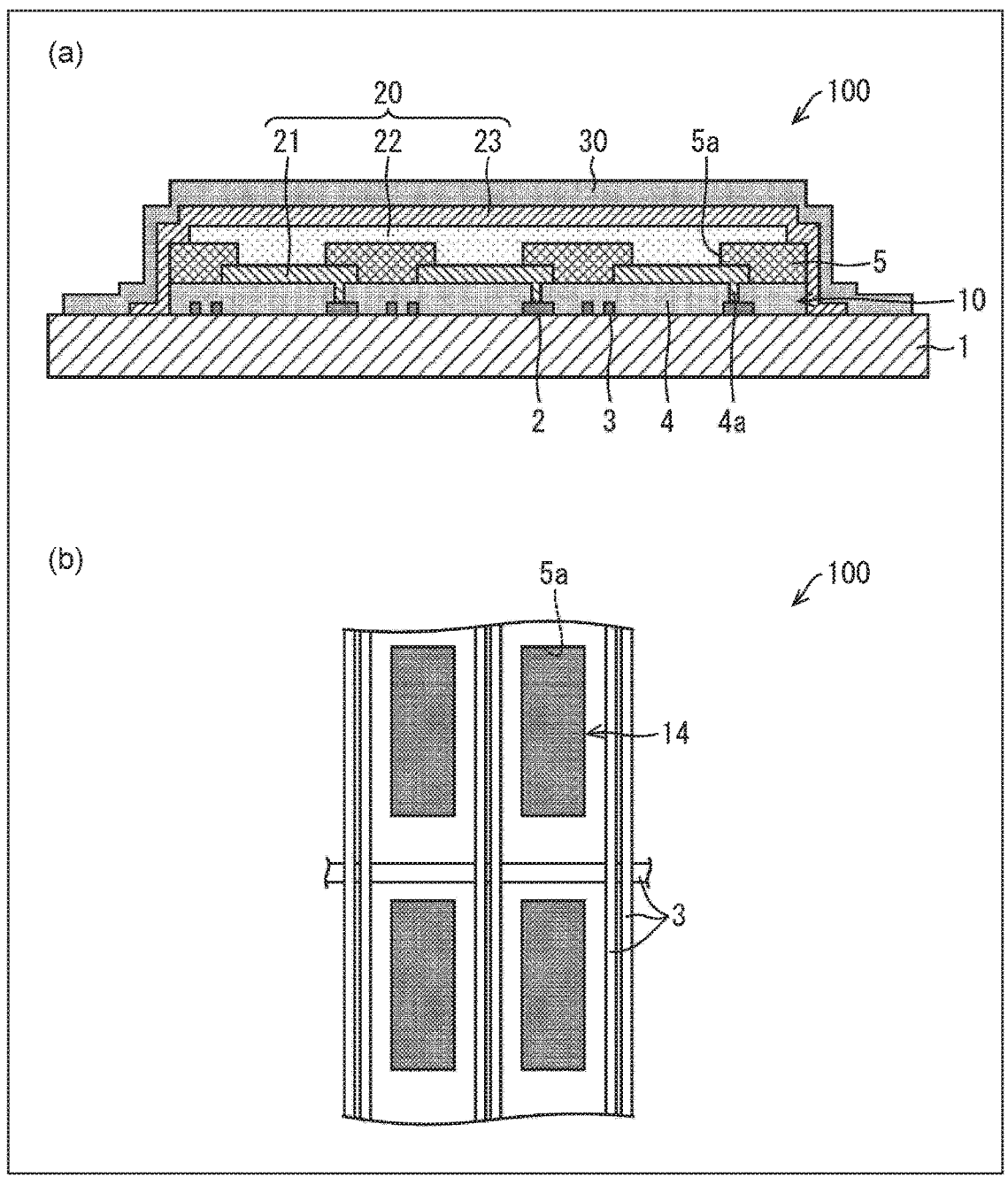
FIG. 2(a) is a sectional view illustrating an exemplary overall structure of the organic EL display device according to the first embodiment of the present invention.
FIG. 2(b) is a plan view illustrating the overall structure of sub-pixels of the organic EL display device illustrated in FIG. 2(a).
Figure 3:
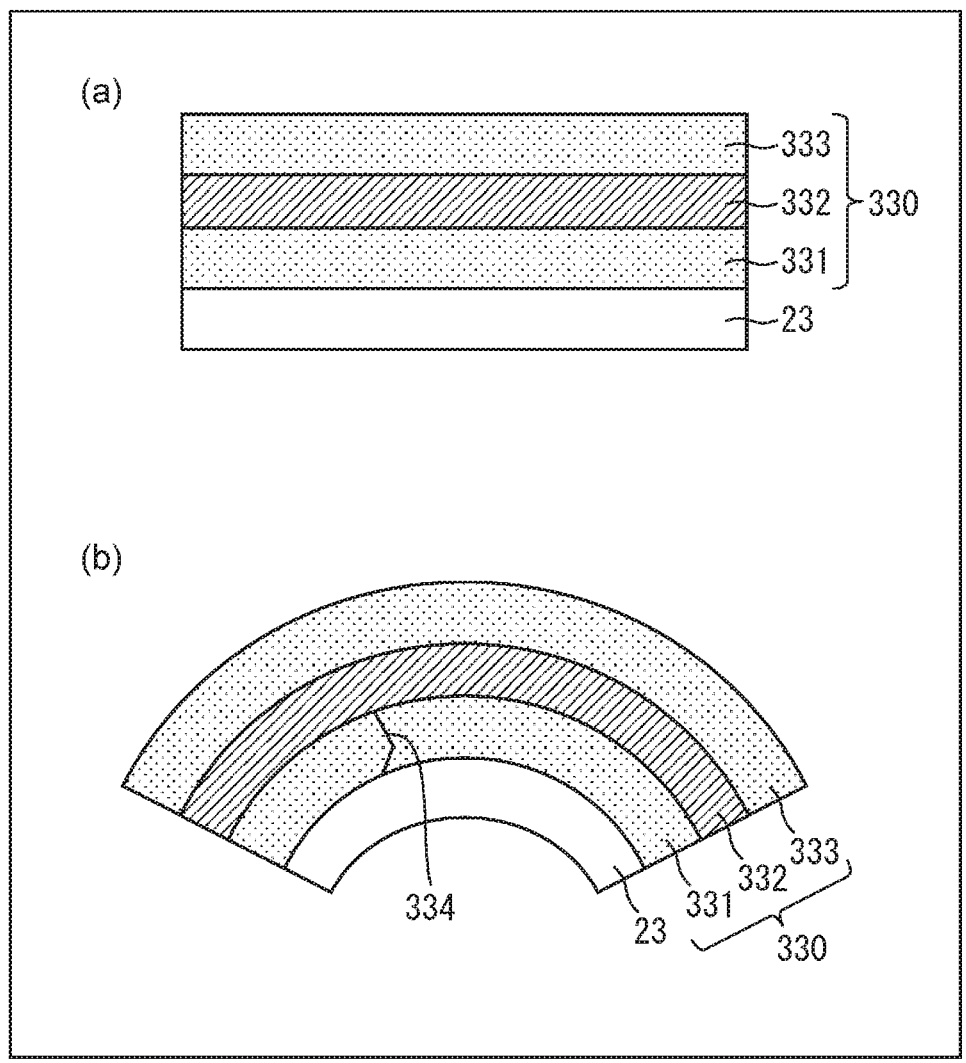
FIG. 3(a) is a sectional view illustrating the structure of a second electrode and a sealing film included in an organic EL display device according to the related art.
FIG. 3(b) is a sectional view illustrating the structure of the second electrode and the sealing film included in the organic EL display device according to the related art in a bent state.
Figure 4:
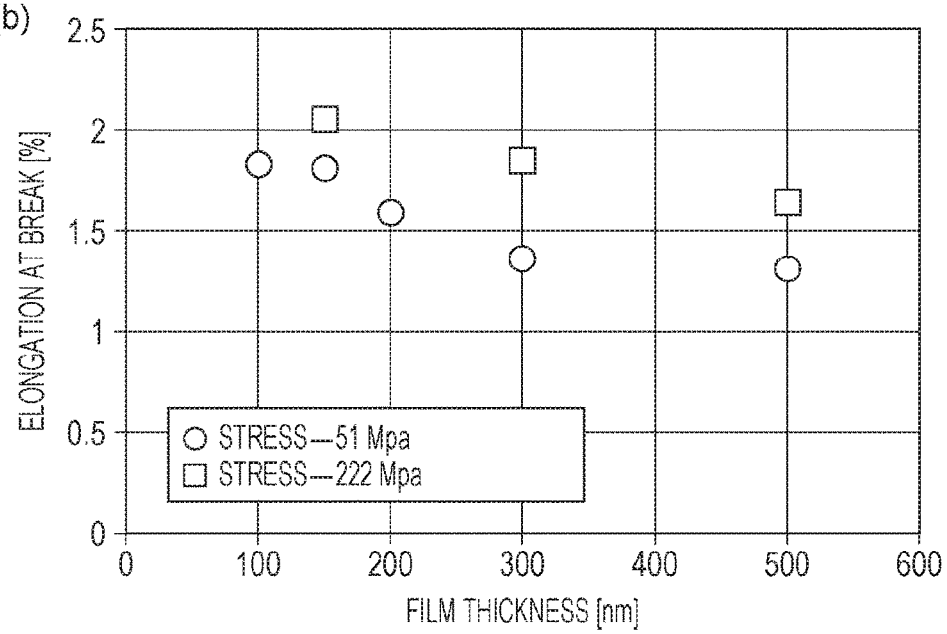
FIG. 4(a) is a table showing the results of a tensile test.
FIG. 4(b) is a graph showing the results of the tensile test.

An embodiment of the present invention will hereinafter be described in detail with reference to FIG. 1 to FIGS. 5(a) and 5(b).

An organic EL display device will be described as an example of an EL display device.

<Overall Structure of Organic EL Display Device>

FIG. 2(a) is a sectional view illustrating an exemplary overall structure of an organic EL display device according to the present embodiment. FIG. 2(b) is a plan view illustrating the overall structure of sub-pixels of the organic EL display device illustrated in FIG. 2(a).

As illustrated in FIG. 2(a), an organic EL display device 100 (EL display device) includes an organic EL element 20 (EL element) and a sealing film 30, which are arranged on a thin film transistor (TFT) substrate 10 in that order from the TFT substrate 10.

The TFT substrate 10 includes an insulating base 1 (substrate) made of, for example, a glass substrate or a plastic film. TFTs 2, signal lines 3, and an interlayer insulating film 4 are provided on the base 1.

The signal lines 3 include a plurality of gate lines, a plurality of source lines, and a plurality of power supply lines. The signal lines 3 are arranged to form a grid, and sub-pixels 14 of respective colors are disposed in the cells of the grid. For example, red (R), green (G), and blue (B) sub-pixels 14 form a single pixel.

Each sub-pixel 14 is provided with a TFT 2. Each TFT 2 is connected to the signal lines 3. The sub-pixels to which a signal is to be input are selected by using the gate lines, and the amount of charge to be input to the selected sub-pixels is set by using the source lines. A current is supplied to the organic EL element 20 through the power supply lines.

The TFTs 2 and the signal lines 3 are covered with the interlayer insulating film 4. The interlayer insulating film 4 may be made of, for example, an insulating material, such as an acrylic resin or polyimide resin. The thickness of the interlayer insulating film 4 is not particularly limited as long as the interlayer insulating film 4 has an even surface above the steps between the top surfaces of the TFTs 2 and the signal lines 3.

The organic EL element 20 is formed of a first electrode (anode), an organic EL layer 22, and a second electrode 23 (cathode).

The first electrode 21 is formed on the interlayer insulating film 4. The first electrode 21 injects (supplies) positive holes into the organic EL layer 22, and the second electrode 23 injects electrons into the organic EL layer 22. The first electrode 21 is electrically connected to the TFTs 2 through contact holes 4a formed in the interlayer insulating film 4.

The first electrode 21 is covered with an edge cover 5 at the edges thereof. The edge cover 5 is an insulating film, and is made of, for example, a photosensitive resin. The edge cover 5 prevents the first electrode 21 from being short-circuited to the second electrode 23 at the edges thereof due to electrode concentration or a reduction in the thickness of the organic EL layer 22. The edge cover 5 also functions as a pixel separation film that prevents current leakage between adjacent sub-pixels 14.

The edge cover 5 has openings 5a for the respective sub-pixels 14. Portions of the first electrode 21 that are exposed at the openings 5a serve as light-emitting regions of the sub-pixels 14.

The organic EL layer 22 is disposed between the first electrode 21 and the second electrode 23. The organic EL layer 22 includes, for example, a positive-hole injecting layer, a positive-hole transporting layer, a light emitting layer, an electron transporting layer, and an electron injecting layer, which are stacked in that order from the first electrode 21. A layer having a plurality of functions may be provided. For example, the positive-hole injecting layer and the positive-hole transporting layer may be replaced by a positive-hole injecting-and-injecting layer having the functions of the positive-hole injecting layer and the positive-hole transporting layer. Also, the electron injecting layer and the electron transporting layer may be replaced by an electron injecting-and-transporting layer having the functions of the electron injecting layer and the electron transporting layer. A carrier blocking layer may be provided between the layers as appropriate.

In FIG. 2(a), the first electrode 21 is an anode (patterned electrode, pixel electrode), and the second electrode 23 is a cathode (common electrode). However, the first electrode 21 and the second electrode 23 may instead be a cathode and an anode, respectively. In such a case, the layers included in the organic EL layer 22 are arranged in the opposite order.

When the organic EL display device 100 is a bottom emission display device that emits light from the back surface of the base 1, the second electrode 23 is preferably made of a reflective electrode material, and the first electrode 21 is preferably made of a transparent or translucent electrode material.

When the organic EL display device 100 is a top emission display device that emits light through a sealing film 30, the first electrode 21 is preferably made of a reflective electrode material, and the second electrode 23 is preferably made of a transparent or translucent electrode material.

The sealing film 30 is formed on the base 1 and the second electrode 23 so as to seal the organic EL element 20 between the sealing film 30 and the base 1. The sealing film 30 prevents deterioration of the organic EL element 20 due to moisture and oxygen that enter from the outside.

An organic layer (optical adjustment layer) (not shown) for adjusting optical characteristics and an electrode protection layer for protecting the second electrode 23 may be provided between the second electrode 23 and the sealing film 30.

<Structure of Sealing Film>

FIG. 1 is a sectional view illustrating the structure of the second electrode and the sealing film included in the organic EL display device according to the present embodiment.

As illustrated in FIG. 1, the sealing film 30 of the organic EL display device 100 according to the present embodiment includes a lower inorganic film 31 (first inorganic film), an organic film 32, and an upper inorganic film 33 (second inorganic film), which are stacked on the second electrode 23 in that order from the second electrode 23.

Although FIG. 1 illustrates the sealing film 30 formed on the second electrode 23, the sealing film 30 is also formed on the base 1, as illustrated in FIG. 2(a), and completely covers the organic EL element 20 in the display region of the organic EL display device 100.

(Lower Inorganic Film 31)

As illustrated in FIG. 1, the lower inorganic film 31 has a multilayer structure including a first inorganic layer 34 (first layer), which is in contact with the second electrode 23, and a second inorganic layer 35 (second layer). The film thickness of the first inorganic layer 34 is less than that of the second inorganic layer 35. The first inorganic layer 34 and the second inorganic layer 35 each have a film stress, and the absolute value of the film stress of the first inorganic layer 34 is less than that of the second inorganic layer 35.

The film stress of each of the first inorganic layer 34 and the second inorganic layer 35 may be either a tensile stress or a compressive stress. In the following description, it is assumed that the first inorganic layer 34 and the second inorganic layer 35 each have a compressive stress.

Inorganic films generally have a higher moisture-proof function than organic films. The sealing film 30 according to the present embodiment includes the lower inorganic film 31 and the upper inorganic film 33 as inorganic films. Accordingly, the sealing film 30 has a high moisture resistance. The moisture resistance is reduced when the lower inorganic film 31 and the upper inorganic film 33 are thin. Therefore, the thicknesses of the lower inorganic film 31 and the upper inorganic film 33 are preferably designed based on the required moisture resistance.

The first inorganic layer 34 and the second inorganic layer 35 each have a compressive stress (film stress). Accordingly, the sealing film 30 has a high elongation at break (breaking strength).

The film thickness of the first inorganic layer 34 is less than that of the second inorganic layer 35, and the absolute value of the compressive stress of the first inorganic layer 34 is also less than that of the second inorganic layer 35. Accordingly, the adhesion of the lower inorganic film 31 to the second electrode 23 and the base 1 is greater than that in the case where the lower inorganic film 31 includes only the second inorganic layer 35 having a high compressive stress. In addition, when the thickness of the first inorganic layer 34 is reduced, three-dimensional force applied to the first inorganic layer 34 when the organic EL display device 100 is bent decreases. Accordingly, the elongation at break of the sealing film 30 can be increased.

The absolute value of the compressive stress of the second inorganic layer 35 is greater than that of the first inorganic layer 34. Therefore, the elongation at break of the sealing film 30 is greater than that in the case where the sealing film 30 includes only the first inorganic layer 34. Accordingly, the occurrence of cracks in the sealing film 30 can be prevented.

The lower inorganic film 31 may be formed by using, for example, silicon nitride (SiN), silicon oxide (SiO), silicon oxynitride (SiON), or aluminum oxide ($Al_2O_3$).

The film thickness of the first inorganic layer 34 is preferably greater than or equal to 100 nm and less than 200 nm. The compressive stress of the first inorganic layer 34 is preferably greater than or equal to −100 MPa and less than 0 MPa. The film thickness of the second inorganic layer 35 is preferably greater than or equal to 200 nm and less than or equal to 300 nm. The compressive stress of the second inorganic layer 35 is preferably greater than or equal to −300 MPa and less than or equal to −100 MPa.

(Organic Film 32)

The organic film 32 is disposed between the lower inorganic film 31 and the upper inorganic film 33. Accordingly, the compressive stresses of the lower inorganic film 31 and the upper inorganic film 33 can be absorbed, and breakage of the lower inorganic film 31 and the upper inorganic film 33 can be prevented when the organic EL display device 100 is bent. In addition, pin holes can be blocked, and film defects due to foreign matter can be prevented.

The organic film 32 may be formed by using, for example, polysiloxane, silicon oxycarbide (SiOC), acrylate, polyuria, parylene, polyimide, or polyamide.

(Upper Inorganic Film 33)

The organic film 32 is generally susceptible to moisture. Accordingly, the upper inorganic film 33 is provided on the organic film 32 to increase the moisture resistance of the sealing film 30.

The upper inorganic film 33 has a multilayer structure similar to that of the lower inorganic film 31. More specifically, the upper inorganic film 33 includes a third inorganic layer 36 (third layer) formed on the organic film 32 and a fourth inorganic layer 37 (fourth layer), which are stacked in that order from the organic film 32.

The film thickness of the third inorganic layer 36 is less than that of the fourth inorganic layer 37. The third inorganic layer 36 and the fourth inorganic layer 37 each have a compressive stress, and the absolute value of the compressive stress of the third inorganic layer 36 is less than that of the fourth inorganic layer 37.

The film thickness, compressive stress, and composition of the third inorganic layer 36 are the same as those of the first inorganic layer 34. The film thickness, compressive stress, and composition of the fourth inorganic layer 37 are the same as those of the second inorganic layer 35.

The third inorganic layer 36 and the fourth inorganic layer 37 each have a compressive stress. Accordingly, the sealing film 30 has a high elongation at break (breaking strength).

The film thickness of the third inorganic layer 36 is less than that of the fourth inorganic layer 37, and the absolute value of the compressive stress of the third inorganic layer 36 is also less than that of the fourth inorganic layer 37. Accordingly, the adhesion between the upper inorganic film 33 and the organic film 32 is greater than that in the case where the upper inorganic film 33 includes only the fourth inorganic layer 37 having a high compressive stress. In addition, when the thickness of the third inorganic layer 36 is reduced, three-dimensional force applied to the third inorganic layer 36 when the organic EL display device 100 is bent decreases. Accordingly, the elongation at break of the sealing film 30 can be increased.

The absolute value of the compressive stress of the fourth inorganic layer 37 is greater than that of the third inorganic layer 36. Therefore, the elongation at break of the sealing film 30 is greater than that in the case where the sealing film 30 includes only the third inorganic layer 36.

The upper inorganic film 33 may be formed by using, for example, silicon nitride (SiN), silicon oxide (SiO), silicon oxynitride (SiON), or alumina ($Al_2O_3$).

The film thickness of the third inorganic layer 36 is preferably greater than or equal to 100 nm and less than 200 nm. The compressive stress of the fourth inorganic layer 37 is preferably greater than or equal to −100 MPa and less than 0 MPa. The film thickness of the fourth inorganic layer 37 is preferably greater than or equal to 200 nm and less than or equal to 300 nm. The compressive stress of the fourth inorganic layer 37 is preferably greater than or equal to −300 MPa and less than −100 MPa.

<Flexibility>

FIG. 3(a) is a sectional view illustrating the structure of a second electrode and a sealing film included in an organic EL display device according to the related art. FIG. 3(b) is a sectional view illustrating the structure of the second electrode and the sealing film included in the organic EL display device according to the related art in a bent state.

As illustrated in FIG. 3(a), a sealing film 330 included in the organic EL display device according to the related art has a multilayer structure including a lower inorganic film 331, an organic film 332, and an upper inorganic film 333, which are stacked on a second electrode 23 in that order from the second electrode 23.

The lower inorganic film 331 preferably has a high compressive stress to increase the elongation at break of the lower inorganic film 331. However, in the organic EL display device according to the related art, the compressive stress of the lower inorganic film 331 is limited to less than or equal to a certain value to ensure sufficient adhesion between the lower inorganic film 331 and the second electrode 23.

Therefore, when the organic EL display device according to the related art is bent, the lower inorganic film 331 may break and a crack 334 may be formed in the lower inorganic film 331, as illustrated in FIG. 3(b). Thus, the sealing performance of the sealing film 330 may be reduced.

In contrast, according to the multilayer structure of the sealing film 30 included in the organic EL display device 100 of the present embodiment, the first inorganic layer 34 provides sufficient adhesion to the organic EL element 20 and the base 1, and the elongation at break can be increased by the second inorganic layer 35.

Accordingly, separation of the sealing film 30 can be prevented, and the bending strength can be increased so that the occurrence of cracks in a bent state can be reduced. Thus, the bending resistance of the organic EL display device 100 in the case where the base 1 is flexible can be increased. The above-described organic EL display device 100 is suitable for use as, for example, a flexible display device that can be bent similarly to a piece of paper, such as electronic paper.

<Tensile Test>

A tensile test for evaluating the elongation at break of the sealing film will now be described.

The tensile test is a test based on JIS K 7127, in which a sample having two parallel reference lines is pulled in opposite directions along a pulling direction. The reference lines are apart from each other by 50 mm in a direction parallel to the pulling direction. The elongation at break of the sample is evaluated based on the distance between the reference lines before the sample is pulled and the distance between the reference lines at the time when the sample breaks. A tensile test was performed by using Autograph produced by Shimadzu Corporation.

In the present embodiment, sheet-shaped sealing films were used as samples for the tensile test.

In the tensile test, the elongations at break of eight types of samples (samples 1 to 8) were evaluated. Sample 1 had a film stress of −51 MPa and a film thickness of 500 nm. Sample 2 had a film stress of −51 MPa and a film thickness of 300 nm. Sample 3 had a film stress of −51 MPa and a film thickness of 200 nm. Sample 4 had a film stress of −51 MPa and a film thickness of 150 nm. Sample 5 had a film stress of −51 MPa and a film thickness of 100 nm. Sample 6 had a film stress of −222 Pa and a film thickness of 500 nm. Sample 7 had a film stress of −222 Pa and a film thickness of 300 nm. Sample 8 had a film stress of −222 Pa and a film thickness of 150 nm.

FIG. 4(a) is a table showing the results of the tensile test. FIG. 4(b) is a graph showing the results of the tensile test.

As described above, an inorganic film having a film stress with a high absolute value has low adhesion to the second electrode 23 and the base 1. Accordingly, by using an inorganic film having a film stress with a low absolute value as the first inorganic layer 34, which is in direct contact with the second electrode 23 and the base 1, the adhesion of the first inorganic layer 34 to the second electrode 23 and the base 1 can be increased.

However, as is clear from the elongations at break of samples 1 to 8 shown in FIGS. 4(a) and 4(b), when the film thickness is constant, an inorganic film having a film stress (compressive stress) with a relatively low absolute value has a lower elongation at break than an inorganic film having a film stress with a relatively high absolute value. Thus, there is a trade-off between the elongation at break and the adhesion.

Therefore, when an inorganic film having a film stress with a relatively low absolute value is used as the first inorganic layer 34, although the adhesion of the first inorganic layer 34 to the second electrode 23 and the base 1 can be increased, the elongation at break of the first inorganic layer 34 is reduced. Breakage starts at films having a low elongation at break. Therefore, the first inorganic layer 34 breaks first.

As is clear from the elongations at break of samples 1 to 8, the elongation at break increases as the film thickness decreases, irrespective of the absolute value of the film stress. When the thickness of an inorganic film is reduced, three-dimensional force applied to the inorganic film decreases, and the elongation at break increases accordingly.

However, the moisture resistance decreases as the thickness of the inorganic film decreases. Thus, there is also a trade-off between the elongation at break and the moisture resistance. Although the thickness of the inorganic film is preferably reduced to increase the elongation at break, the thickness of the inorganic film is preferably increased to ensure sufficient moisture resistance.

The elongations at break of samples 1 to 5 will be compared with the elongations at break of sample 6 to 8. When, for example, the compressive stress is −51 MPa, an elongation at break that is substantially equivalent to that of sample 7, which has a compressive stress of −222 MPa and a film thickness of 300 nm, can be obtained if the film thickness is less than 200 nm, as in samples 4 and 5. The elongations at break of samples 4 and 5 are greater than that of sample 6, which has a compressive stress of −222 MPa and a film thickness of 500 nm. Also, it can be said that the elongation at break of sample 3, which has a compressive stress of −51 MPa and a film thickness of 200 nm, is almost as high as that of sample 6, which has a compressive stress of −222 MPa and a film thickness of 500 nm.

This shows that the elongation at break of an inorganic film having a film stress with a relatively low absolute value can be increased to a value as high as that of an inorganic film having a film stress with a relatively high absolute value by reducing the film thickness.

When the film thickness of an inorganic film having a film stress with a relatively low absolute value is increased, in particular, when the film thickness of the first inorganic layer 34 is increased, the overall film stress of the inorganic film (for example, the product of the film thickness and film stress of the first inorganic layer 34) is increased. As a result, the adhesion is reduced. Therefore, the first inorganic layer 34 preferably has a relatively small film thickness.

Accordingly, an inorganic film having a film stress with a relatively low absolute value is used as the first inorganic layer 34, an inorganic film having a film stress with a relatively high absolute value is used as the second inorganic layer 35, and the film thickness of the first inorganic layer 34 is set so as to be less than that of the second inorganic layer 35. Thus, the lower inorganic film 31 has sufficient moisture resistance, and the adhesion of the lower inorganic film 31 to the second electrode 23 and the base 1 and the elongation at break of the lower inorganic film 31 can be increased.

Preferred film thicknesses of the first inorganic layer 34 and the second inorganic layer 35 and preferred film thicknesses of an inorganic film having a film stress with a relatively low absolute value and an inorganic film having a film stress with a relatively high absolute value will be further discussed.

The elongations at break of samples 1 to 5 show that when the compressive stress is −51 MPa and when the film thickness is in the range of greater than or equal to 100 nm and less than or equal to 500 nm, the elongation at break increases as the film thickness decreases. When the film thickness is greater than or equal to 200 nm, the elongation at break rapidly decreases. Also, the elongations at break of samples 6 to 8 show that when the compressive stress is −222 MPa, the elongation at break gradually decreases as the film thickness increases.

When inorganic layers having film stresses with different absolute values, such as the first inorganic layer 34 and the second inorganic layer 35, are stacked together, the above-described effect can be obtained as long as the film thickness of the inorganic film having a film stress with a lower absolute value is less that of the inorganic film having a film stress with a higher absolute value, as described above. However, the inorganic film having a film stress with a lower absolute value, in particular, the first inorganic layer 34, preferably has a film thickness of less than 200 nm.

The elongation at break of the inorganic film having a film stress with a higher absolute value does not have a clear point of inflexion. However, when the film thickness is increased, the overall film stress of the lower inorganic film 31 is increased accordingly. Also, in the case where the inorganic film having a film stress with a lower absolute value has a film thickness of less than 200 nm, if the inorganic film having a film stress with a higher absolute value has a film thickness of greater than 300 nm, the elongation at break thereof tends to be less than that of the inorganic film having a film stress with a lower absolute value. Therefore, when the film thickness of the inorganic film having a film stress with a lower absolute value is set to less than 200 nm, the film thickness of the inorganic film having a film stress with a higher absolute value is preferably set to, for example, less than or equal to 300 nm.

In addition, as described above, to ensure sufficient moisture resistance, the film thickness of the inorganic film having a film stress with a lower absolute value is preferably reduced within a range such that sufficient moisture resistance can be obtained.

<Ca Test>

A Ca test for evaluating the moisture resistance of the sealing film will now be described.

The Ca test is a test in which calcium covered with a sample is placed in a high-temperature high-humidity environment so that the calcium is partially corroded by water vapor. The moisture resistance of the sample is evaluated based on the residual rate of the calcium.

In the present embodiment, sheet-shaped sealing films formed on glass substrates were used as samples for the Ca test.

In the Ca test, calcium was covered with the samples and placed in a high-temperature high-humidity environment in which the temperature was 80° C. and the humidity was 85% for 220 hours, and the moisture resistances of the samples were evaluated based on the calcium residual rate.

Figures 5, 6:
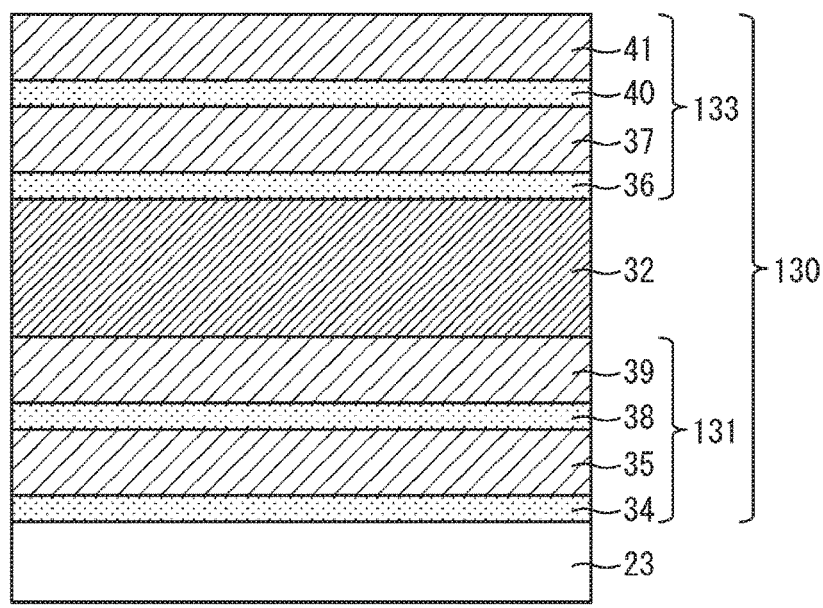
FIG. 5 is a table showing the results of a Ca test.
FIG. 6 is a sectional view illustrating the structure of a second electrode and a sealing film included in an organic EL display device according to a second embodiment of the present invention.

FIG. 5 is a table showing the results of the Ca test.

In the Ca test, the moisture resistances of four types of samples (sample 1 to sample 4) were evaluated.

Sample 1 had a film thickness of 500 nm and included a 100-nm-thick inorganic film having a low compressive stress, a 300-nm-thick inorganic film having a high compressive stress, and a 100-nm-thick inorganic film having a low compressive stress, which are stacked on a glass substrate in that order from the glass substrate.

Sample 2 had a film thickness of 500 nm and included a 200-nm-thick inorganic film having a high compressive stress, a 100-nm-thick inorganic film having a low compressive stress, and a 200-nm-thick inorganic film having a high compressive stress, which are stacked in that order.

Sample 3 had a film thickness of 500 nm and had a five-layer structure in which a 100-nm-thick inorganic film having a high compressive stress and a 100-nm-thick inorganic film having a low compressive stress were alternately stacked so that the layers at both ends are 100-nm-thick inorganic films having a high compressive stress.

Sample 4 had a film thickness of 495 nm and had a nine-layer structure in which a 55-nm-thick inorganic film having a high compressive stress and a 55-nm-thick inorganic film having a low compressive stress were alternately stacked so that the layers at both ends are 55-nm-thick inorganic films having a high compressive stress.

In each sample, the inorganic films having a low compressive stress had a compressive stress equivalent to that of the first inorganic layer 34 of the sealing film 30 according to the first embodiment (greater than or equal to −100 MPa and less than 0 MPa), and the inorganic films having a high compressive stress had a compressive stress equivalent to that of the second inorganic layer 35 of the sealing film 30 according to the first embodiment (greater than or equal to −300 MPa and less than −100 MPa).

In the table of FIG. 5, the compressive stress column shows the order in which the inorganic films having a low compressive stress and the inorganic films having a high compressive stress were stacked in each sample. The inorganic films listed from left to right were stacked on the glass substrate in the mentioned order from the glass substrate.

Referring to FIG. 5, the Ca residual rate of sample 1 is 70.2%. In sample 1, similar to the lower inorganic film 31 and the upper inorganic film 33 of the sealing film 30 according to the present embodiment, the films having a low compressive stress have a film thickness of 100 nm, and the film having a high compressive stress has a film thickness of 300 nm. This shows that the lower inorganic film 31 and the upper inorganic film 33 of the sealing film 30 according to the present embodiment have a sufficient moisture resistance.

Samples 1, 3, and 4 will be compared with each other with reference to FIG. 5. In each of samples 1 and 3, the inorganic films having a low compressive stress have a total film thickness of 200 nm. In sample 4, the inorganic films having a low compressive stress have a total film thickness of 220 nm. Thus, the inorganic films having a low compressive stress have similar total film thicknesses in samples 1, 3, and 4. The inorganic films having a low compressive stress included in samples 1 and 3 each have a film thickness of 100 nm, and the inorganic films having a low compressive stress included in sample 4 each have a film thickness of 55 nm. The Ca residual rates of samples 1 and 3 after the test are greater than that of sample 4, which shows that the moisture resistance can be increased by setting the film thickness of the inorganic films having a low compressive stress to greater than or equal to 100 nm.

Samples 2 and 3 will now be compared with each other. The inorganic films having a low compressive stress included in samples 2 and 3 have a film thickness of 100 nm, and samples 2 and 3 both have a total film thicknesses of 500 nm. The inorganic films having a high compressive stress included in sample 2 have a film thickness of 200 nm, and the inorganic films having a high compressive stress included in sample 3 have a film thickness of 100 nm. The Ca residual rate of sample 2 after the test is greater than that of sample 3, which shows that the moisture resistance can be increased by setting the film thickness of the inorganic films having a high compressive stress to greater than or equal to 200 nm.

Samples 1 and 3 will now be compared with each other. In each of samples 1 and 3, the inorganic films having a high compressive stress have a total film thickness of 300 nm. Samples 1 and 3 both have a total film thickness of 500 nm. The inorganic film having a high compressive stress included in sample 1 has a film thickness of 300 nm, and the inorganic films having a high compressive stress included in sample 3 each have a film thickness of 100 nm. The Ca residual rate of sample 3 after the test is greater than that of sample 1. Sample 1 shows that even when the film thickness of the inorganic films having a low film stress is as small as 100 nm, sufficient moisture resistance can be obtained by setting the film thickness of the inorganic film having a film stress with a high absolute value to less than or equal to 300 nm. However, the moisture resistance can be further increased by setting the film thickness of the inorganic film having a film stress with a high absolute value to less than 300 nm.

The results of the above-described Ca test show that, to increase the moisture resistance of the sealing film 30, the film thickness of the first inorganic layer 34, which is an inorganic film having a film stress with a low absolute value, is preferably greater than or equal to 100 nm, and that the film thickness of the second inorganic layer 35, which is an inorganic film having a film stress with a high absolute value, is preferably greater than or equal to 200 nm and less than or equal to 300 nm, and more preferably, greater than or equal to 200 nm and less than 300 nm.

In addition, the results of the Ca test and the tensile test show that, to increase both the moisture resistance and elongation at break of the sealing film 30, the film thickness of the first inorganic layer 34, which has a low compressive stress that is greater than or equal to −100 MPa and less than 0 MPa, is preferably greater than or equal to 100 nm and less than 200 nm, and the film thickness of the second inorganic layer 35, which has a high compressive stress that is greater than or equal to −300 MPa and less than −100 MPa, is preferably greater than or equal to 200 nm and less than or equal to 300 nm, and more preferably, greater than or equal to 200 nm and less than 300 nm.

<Others>

In the above description, the upper inorganic film 33 has a multilayer structure similar to that of the lower inorganic film 31. The film thickness, compressive stress, and composition of the third inorganic layer 36 are the same as those of the first inorganic layer 34, and the film thickness, compressive stress, and composition of the fourth inorganic layer 37 are the same as those of the second inorganic layer 35. However, the structure of the sealing film 30 according to the present embodiment is not limited to this.

The film thicknesses, compressive stresses, and compositions of the third inorganic layer 36 and the fourth inorganic layer 37 of the upper inorganic film 33 may be different from those of the first inorganic layer 34 and the second inorganic layer 35 as long as the absolute value of the compressive stress of the fourth inorganic layer 37 is greater than that of the third inorganic layer 36.

<Method for Forming Sealing Film>

A method for forming the sealing film according to the present embodiment will now be described. In the example described below, silicon nitride films are formed as the lower inorganic film 31 and the upper inorganic film 33.

The sealing film 30 can be formed by using a plasma chemical vapor deposition (CVD) apparatus.

First, the base 1 on which the organic EL element 20 is formed is placed in a vacuum chamber. Then, a mixture of gases including monosilane, ammonia, nitrogen, and hydrogen gases is introduced into the vacuum chamber, and the first inorganic layer 34 is formed on the second electrode 23 and the base 1 by plasma discharge.

Next, the base 1 on which the first inorganic layer 34 is formed is placed in the vacuum chamber. Then, a mixture of gases including monosilane, ammonia, nitrogen, and hydrogen gases is introduced into the vacuum chamber, and the second inorganic layer 35 is formed on the first inorganic layer 34 by plasma discharge.

Next, the base 1 on which the lower inorganic film 31 is formed is placed in the vacuum chamber, and the organic film 32 is formed on the lower inorganic film 31 by a known vapor deposition method.

Next, the base 1 on which the organic film 32 is formed is placed in the vacuum chamber. Then, a mixture of gases including monosilane, ammonia, nitrogen, and hydrogen gases is introduced into the vacuum chamber, and the third inorganic layer 36 is formed on the organic film 32 by plasma discharge.

Next, the base 1 on which the third inorganic layer 36 is formed is placed in the vacuum chamber. Then, a mixture of gases including monosilane, ammonia, nitrogen, and hydrogen gases is introduced into the vacuum chamber, and the fourth inorganic layer 37 is formed on the third inorganic layer 36 by plasma discharge.

In the step of forming the lower inorganic film 31 and the upper inorganic film 33 (film forming step), the film stresses of the formed films can be adjusted by controlling the flow rates of the gases including monosilane, ammonia, nitrogen, and hydrogen gases.

In a method for manufacturing the organic EL display device 100 according to the present embodiment, the sealing film 30 is formed by setting electric power for plasma discharge to 900 W, a monosilane flow rate to 243 sccm, an ammonia flow rate to 435 sccm, a nitrogen flow rate to 4000 sccm, and a hydrogen flow rate to 2500 sccm in the steps of forming the lower inorganic film 31 and the upper inorganic film 33. Thus, the first inorganic layer 34 of the lower inorganic film 31 is formed so that the film thickness thereof is greater than or equal to 100 nm and less than 200 nm, and that the compressive stress thereof is greater than or equal to −100 MPa and less than 0 MPa. Also, the second inorganic layer 35 of the lower inorganic film 31 is formed so that the film thickness thereof is greater than or equal to 200 nm and less than or equal to 300 nm, and that the compressive stress thereof is greater than or equal to −300 MPa and less than −100 MPa.

Although the sealing film 30 is formed by the CVD method by using the plasma CVD apparatus in the above-described example, the method for forming the sealing film 30 is not limited to this. The sealing film 30 may instead be formed by sputtering or by an atomic layer deposition (ALD) method. The CVD method and ALD method are suitable because they provide good step coverage. To prevent the sealing film 30 from being formed in regions including, for example, external-electric-wire connecting portions (terminal portions), a deposition mask having an opening may be used so that the sealing film 30 is formed only in regions where it is required.

Second Embodiment

Another embodiment of the present invention will be described with reference to FIG. 6. For convenience of description, components having the same functions as those of the components of the above-described embodiment are denoted by the same reference numerals, and description thereof is omitted.

FIG. 6 is a sectional view illustrating the structure of a second electrode and a sealing film included in an organic EL display device according to the present embodiment.

As illustrated in FIG. 6, the organic EL display device according to the present embodiment have the same structure as the organic EL display device 100 according to the first embodiment except that a lower inorganic film 131 and an upper inorganic film 133 of a sealing film 130 each have a four-layer structure.

(Lower Inorganic Film 131)

The lower inorganic film 131 includes a first inorganic layer 34 (first layer), a second inorganic layer 35 (second layer), a fifth inorganic layer 38, and a sixth inorganic layer 39, which are stacked on a second electrode 23 in that order from the second electrode 23.

The film thickness of the first inorganic layer 34 is less than that of the second inorganic layer 35. The first inorganic layer 34 and the second inorganic layer 35 each have a compressive stress, and the absolute value of the compressive stress of the first inorganic layer 34 is less than that of the second inorganic layer 35.

The film thickness and compressive stress of the fifth inorganic layer 38 are the same as those of the first inorganic layer 34, and the film thickness and compressive stress of the sixth inorganic layer 39 are the same as those of the second inorganic layer 35.

(Upper Inorganic Film 133)

The upper inorganic film 133 includes a third inorganic layer 36, a fourth inorganic layer 37, a seventh inorganic layer 40, and an eighth inorganic layer 41, which are stacked on the organic film 32 in that order from the second electrode 23.

The film thickness of the third inorganic layer 36 is less than that of the fourth inorganic layer 37. The third inorganic layer 36 and the fourth inorganic layer 37 each have a compressive stress, and the absolute value of the compressive stress of the third inorganic layer 36 is less than that of the fourth inorganic layer 37.

The film thickness and compressive stress of the seventh inorganic layer 40 are the same as those of the third inorganic layer 36, and the film thickness and compressive stress of the eighth inorganic layer 41 are the same as those of the fourth inorganic layer 37.

In the sealing film 130 according to the present embodiment, the lower inorganic film 131 has a multilayer structure including two thin films having a low compressive stress (first inorganic layer 34 and fifth inorganic layer 38) and two thick films having a high compressive stress (second inorganic layer 35 and sixth inorganic layer 39). The upper inorganic film 133 has a multilayer structure including two thin films having a low compressive stress (third inorganic layer 36 and seventh inorganic layer 40) and two thick films having a high compressive stress (fourth inorganic layer 37 and eighth inorganic layer 41).

Although the lower inorganic film 131 and the upper inorganic film 133 each have a four-layer structure, the organic film 32 having a low moisture resistance is disposed only between the lower inorganic film 131 and the upper inorganic film 133.

Accordingly, the sealing film 130 having a higher sealing performance (barrier performance) than the sealing film 30 according to the first embodiment can be obtained without increasing the number of organic films 32 and increasing the thickness of the sealing film 130.

In the above-described example, the lower inorganic film 131 and the upper inorganic film 133 each have a multilayer structure including two thin films having a low compressive stress and two thick films having a high compressive stress. However, the multilayer structure of the lower inorganic film 131 and the upper inorganic film 133 according to the present embodiment is not limited to this. The lower inorganic film 131 and the upper inorganic film 133 may instead have a multilayer structure including three or more thin films having a low compressive stress and three or more thick films having a high compressive stress.

Third Embodiment

Another embodiment of the present invention will be described with reference to FIG. 7. For convenience of description, components having the same functions as those of the components of the above-described embodiments are denoted by the same reference numerals, and description thereof is omitted.

Figure 7:
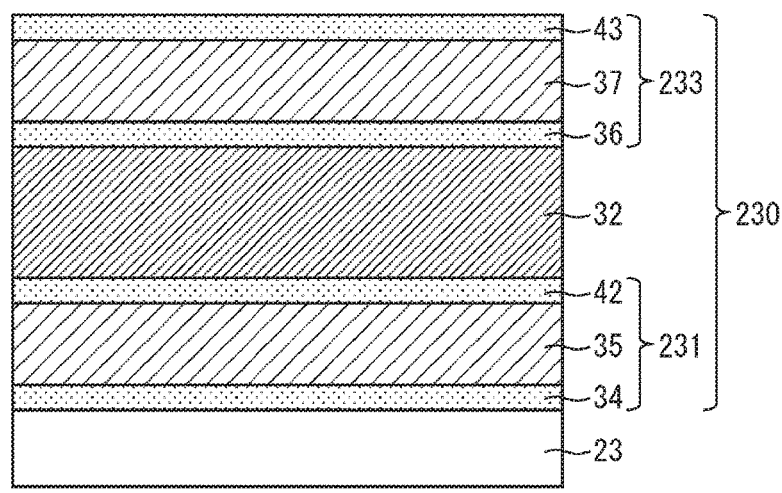
FIG. 7 is a sectional view illustrating the structure of a second electrode and a sealing film included in an organic EL display device according to a third embodiment of the present invention.

FIG. 7 is a sectional view illustrating the structure of a second electrode and a sealing film included in an organic EL display device according to the present embodiment.

As illustrated in FIG. 7, the organic EL display device according to the present embodiment have the same structure as the organic EL display device 100 according to the first embodiment except that a lower inorganic film 231 and an upper inorganic film 233 of a sealing film 230 each have a three-layer structure.

(Lower Inorganic Film 231)

The lower inorganic film 231 includes a first inorganic layer 34 (first layer), a second inorganic layer 35 (second layer), and a ninth inorganic layer 42, which are stacked on a second electrode 23 in that order from the second electrode 23.

The film thicknesses of the first inorganic layer 34 and the ninth inorganic layer 42 are less than that of the second inorganic layer 35. The first inorganic layer 34, the second inorganic layer 35, and the ninth inorganic layer 42 each have a compressive stress, and the absolute values of the compressive stresses of the first inorganic layer 34 and the ninth inorganic layer 42 are less than that of the second inorganic layer 35.

The film thickness and compressive stress of the ninth inorganic layer 42 are the same as those of the first inorganic layer 34.

(Upper Inorganic Film 233)

The upper inorganic film 233 includes a third inorganic layer 36, a fourth inorganic layer 37, and a tenth inorganic layer 43, which are stacked on the organic film 32 in that order from the organic film 32.

The film thicknesses of the third inorganic layer 36 and the tenth inorganic layer 43 are less than that of the fourth inorganic layer 37. The third inorganic layer 36, the fourth inorganic layer 37, and the tenth inorganic layer 43 each have a compressive stress, and the absolute values of the compressive stresses of the third inorganic layer 36 and the tenth inorganic layer 43 are less than that of the fourth inorganic layer 37.

The film thickness and compressive stress of the tenth inorganic layer 43 are the same as those of the third inorganic layer 36.

Since the lower inorganic film 231 and the upper inorganic film 233 included in the sealing film 230 of the present embodiment each have a three-layer structure, the sealing performance (barrier performance) of the sealing film 230 is higher than that of the sealing film 30 according to the first embodiment.

Fourth Embodiment

Another embodiment of the present invention will be described with reference to FIG. 8 to FIGS. 10(a) to 10(c). For convenience of description, components having the same functions as those of the components of the above-described embodiments are denoted by the same reference numerals, and description thereof is omitted.

Figure 8:
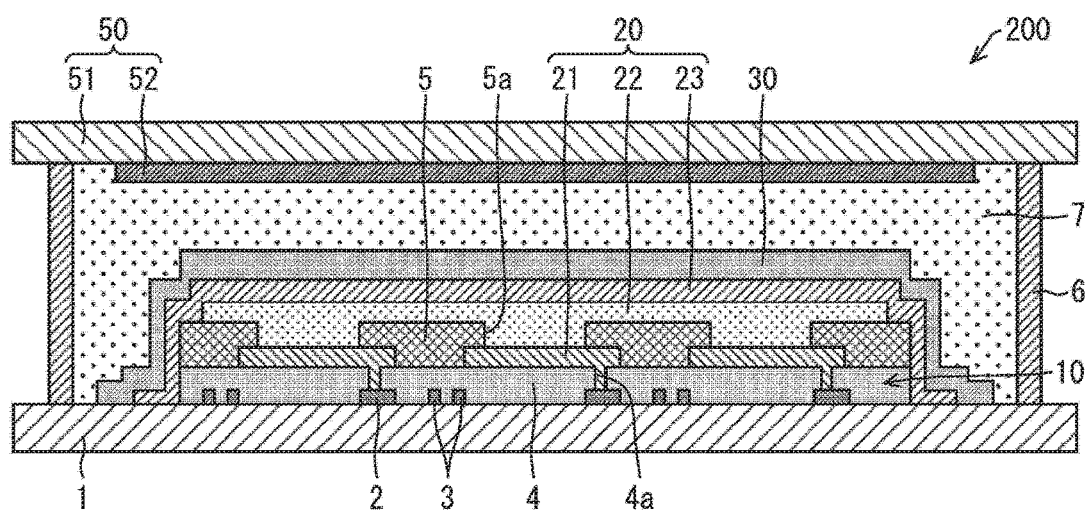
FIG. 8 is a sectional view illustrating an exemplary overall structure of an organic EL display device according to a fourth embodiment of the present invention.

FIG. 8 is a sectional view illustrating an exemplary overall structure of an organic EL display device according to the present embodiment.

As illustrated in FIG. 8, an organic EL display device 200 according to the present embodiment has the same structure as the organic EL display device 100 according to the first embodiment except that a counter substrate is provided and the space between the counter substrate and the TFT substrate is filled with a filler.

The organic EL display device 200 includes a counter substrate 50 that is joined to the TFT substrate 10 so as to face the TFT substrate 10. The counter substrate 50 includes a counter base 51 and a color filter 52 provided on a surface of the counter base 51 that faces the TFT substrate 10.

The counter substrate 50 and the TFT substrate 10 (substrate on which the organic EL element 20 is formed) are positioned and joined together so that each of light transmitting regions of the color filter 52 faces a corresponding sub-pixel of the TFT substrate 10.

The color filter 52 has a function of modulating light emitted from the organic EL element 20. When, for example, the organic EL element 20 emits white light, the color filter 52 may be configured to emit red (R) light, green (G) light, or blue (B) for each sub-pixel by modulating the white light. Alternatively, when, for example, the organic EL element 20 emits red (R), green (G), or blue (B) light for each sub-pixel, the color filter 52 may be used to modulate the light of each color to increase the color purity or reduce a color shift due to a change in the viewing angle.

When monochromatic light may be used without any problem or when it is not necessary to control the color purity or color shift of the light emitted from the organic EL element 20, the color filter 52 may be omitted.

When the base 1 of the TFT substrate 10 and the counter base 51 of the counter substrate 50 are flexible, the organic EL display device 200 may be formed as a flexible or bendable display.

A gap spacer may be provided on the TFT substrate 10 to prevent the counter substrate 50 from coming into contact with the organic EL element 20 and damaging the organic EL element 20.

A sealant 6 is disposed between the TFT substrate 10 and the counter substrate 50 so as to surround the display region. A space surrounded by the TFT substrate 10, the counter substrate 50, and the sealant 6 is filled with a filler 7.

A low moisture permeability material may be used as the sealant 6.

A low moisture permeability material or a material containing a drying agent or oxygen absorber may be used as the filler 7. When the filler 7 is a non-curable filler 7, the filler 7 is interposed between the two substrates in a liquid state. When the filler 7 is a curable filler 7 and when the filler 7 and the sealing film 30 sufficiently prevent moisture and oxygen from entering the organic EL element 20 so that high reliability is ensured, the sealant 6 may be omitted. In the manufacturing process of the organic EL display device 200, the filler 7 is injected into the space surrounded by the sealant 6 after the sealing film 30 is formed and irradiated with laser.

Figure 9:
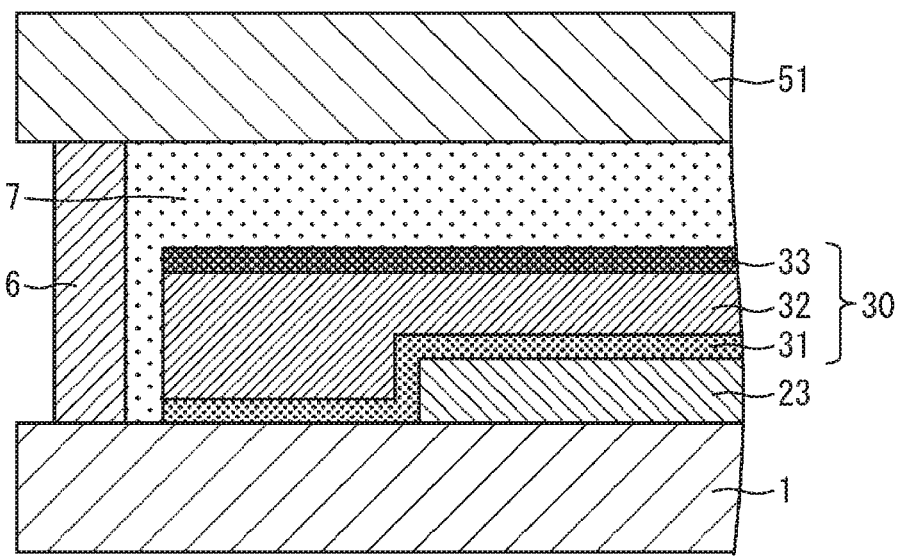
FIG. 9 is a sectional view of a portion of the organic EL display device according to the fourth embodiment of the present invention.
Figure 10:
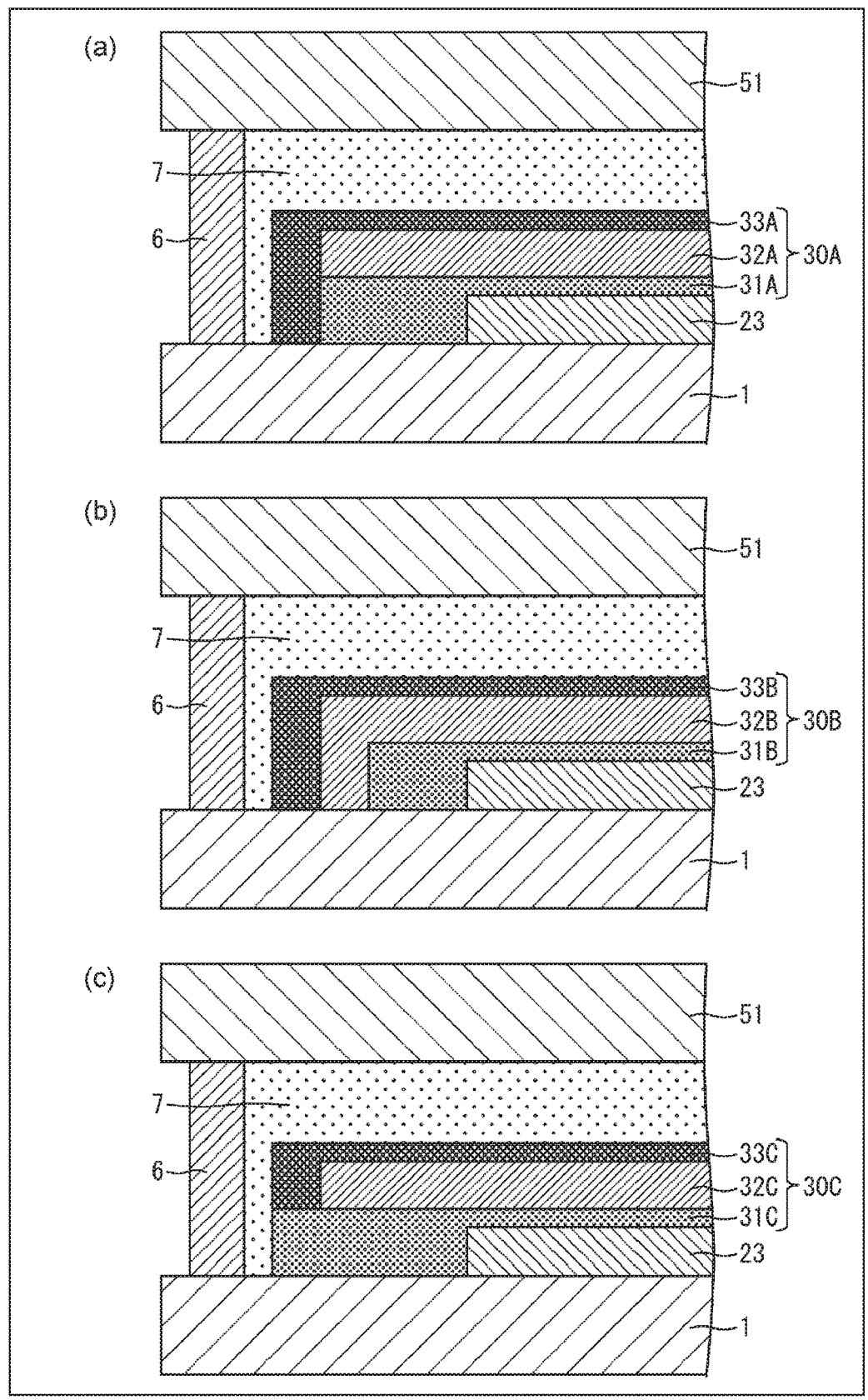
FIGS. 10(a) to 10(c) are sectional views of portions of organic EL display devices according to modifications of the fourth embodiment of the present invention.

FIG. 9 is a sectional view illustrating a portion of the organic EL display device according to the present embodiment.

The space surrounded by the TFT substrate 10, the counter substrate 50, and the sealant 6 is filled with the filler 7 to seal the organic EL element 20 and the sealing film 30. Accordingly, as illustrated in FIG. 9, a multilayer end surface of the sealing film 30 (multilayer sealing film) is covered with the filler 7. Thus, the risk that moisture and oxygen will enter along the boundaries between the layers of the sealing film 30 can be reduced.

The lower inorganic film 31 is formed on the base 1 so as to cover the end surface of the second electrode 23. The organic film 32 is stacked on the lower inorganic film 31, and the upper inorganic film 33 is stacked on the organic film 32. The multilayer end surface of the sealing film 30, which is formed of the end surface of the lower inorganic film 31, the end surface of the organic film 32, and the end surface of the upper inorganic film 33, is flat.

In the organic EL display device 200 according to the present embodiment, the sealant 6 and the filler 7 reduce the risk that moisture and oxygen will enter the organic EL element 20 through the multilayer end surface of the sealing film 30. Therefore, deterioration of the organic EL element 20 can be further reduced, and the reliability of the organic EL display device 200 can be increased.

<Modifications>

FIGS. 10(a) to 10(c) are sectional views of portions of organic EL display devices according to modifications of the present embodiment.

FIG. 10(a) is a sectional view of a portion of an organic EL display device according to a first modification. The organic EL display device according to the first modification includes a sealing film 30A including a lower inorganic film 31A, an organic film 32A, and an upper inorganic film 33A, which are stacked in that order from the base 1. The upper inorganic film 33A covers the multilayer end surface of the lower inorganic film 31A and the organic film 32A (end surfaces of the lower inorganic film 31A and the organic film 32A).

More specifically, the lower inorganic film 31A is formed on the base 1 so as to cover the end surface of a second electrode 23. The organic film 32A is stacked on the lower inorganic film 31. The upper inorganic film 33A is formed on the base 1 so as to cover the top surface of the organic film 32A and the multilayer end surface of the lower inorganic film 31A and the organic film 32A. The multilayer end surface of the lower inorganic film 31A and the organic film 32A is flat.

Although not illustrated, in the first modification, the lower inorganic film 31A has a structure similar to that of the lower inorganic film 31 according to the first embodiment, the organic film 32A has a structure similar to that of the organic film 32 according to the first embodiment, and the upper inorganic film 33A has a structure similar to that of the upper inorganic film 33 according to the first embodiment. More specifically, the lower inorganic film 31A has a multilayer structure including a first inorganic layer 34 and a second inorganic layer 35, and the upper inorganic film 33A has a multilayer structure including a third inorganic layer 36 and a fourth inorganic layer 37.

In general, organic films have a lower moisture resistance than inorganic films. However, according to the structure of the first modification, the surfaces (top and end surfaces) of the organic film 32A are covered with the upper inorganic film 33A, and therefore the surfaces of the organic film 32A are not exposed. Accordingly, the risk that moisture and oxygen will enter the organic EL element 20 from the surfaces of the organic film 32A can be reduced.

FIG. 10(b) is a sectional view of a portion of an organic EL display device according to a second modification. The organic EL display device according to the second modification includes a sealing film 30B including a lower inorganic film 31B, an organic film 32B, and an upper inorganic film 33B, which are stacked in that order from the base 1. The organic film 32B covers the surfaces of the lower inorganic film 31B, and the upper inorganic film 33B covers the surfaces of the organic film 32B.

More specifically, the lower inorganic film 31B is formed on the base 1 so as to cover the end surface of a second electrode 23. The organic film 32B is formed on the base 1 so as to cover the top and end surfaces of the lower inorganic film 31B. The upper inorganic film 33B is formed on the base 1 so as to cover the top and end surfaces of the organic film 32B.

Although not illustrated, in the second modification, the lower inorganic film 31B has a structure similar to that of the lower inorganic film 31 according to the first embodiment, the organic film 32B has a structure similar to that of the organic film 32 according to the first embodiment, and the upper inorganic film 33B has a structure similar to that of the upper inorganic film 33 according to the first embodiment. More specifically, the lower inorganic film 31B has a multilayer structure including a first inorganic layer 34 and a second inorganic layer 35, and the upper inorganic film 33B has a multilayer structure including a third inorganic layer 36 and a fourth inorganic layer 37.

According to the structure of the second modification, among the films that constitute the sealing film 30B, the surfaces of the lower inorganic film 31B, which is closest to the organic EL element 20, are covered with both the organic film 32B and the upper inorganic film 33B. Therefore, the risk that moisture and oxygen will reach the lower inorganic film 31B can be reduced. As a result, the risk that moisture and oxygen will enter the organic EL element 20 can be reduced.

FIG. 10(c) is a sectional view of a portion of an organic EL display device according to a third modification. The organic EL display device according to the third modification includes a sealing film 30C including a lower inorganic film 31C, an organic film 32C, and an upper inorganic film 33C, which are stacked in that order from the base 1. The upper inorganic film 33C covers the end surface of the organic film 32C.

More specifically, the lower inorganic film 31C is formed on the base 1 so as to cover the end surface of a second electrode 23. The organic film 32C and the upper inorganic film 33C are stacked so that the organic film 32C covers a portion of the top surface of the lower inorganic film 31C, and that the upper inorganic film 33C covers the surfaces of the organic film 32C and the top surface of the lower inorganic film 31C. The upper inorganic film 33C is stacked on the lower inorganic film 31C so that the end surface thereof flushes with the end surface of the lower inorganic film 31C.

Although not illustrated, in the third modification, the lower inorganic film 31C has a structure similar to that of the lower inorganic film 31 according to the first embodiment, the organic film 32C has a structure similar to that of the organic film 32 according to the first embodiment, and the upper inorganic film 33C has a structure similar to that of the upper inorganic film 33 according to the first embodiment. More specifically, the lower inorganic film 31C has a multilayer structure including a first inorganic layer 34 and a second inorganic layer 35, and the upper inorganic film 33C has a multilayer structure including a third inorganic layer 36 and a fourth inorganic layer 37.

According to the first to third modifications, the risk that moisture and oxygen will enter the organic EL element 20 from the surfaces of the organic film 32A, 32B, 32C can be reduced. In addition, the risk that moisture and oxygen will enter along the boundaries between the layers of the sealing film can be more reliably reduced.

Although the organic EL display device 100 is described as an example of an EL display device, the present invention is not limited to this. The EL display device according to the present invention may instead be an inorganic EL display device including an inorganic EL layer formed of an inorganic compound layer. When the present invention is applied to an inorganic EL display device, the occurrence of cracks in the sealing film 30 can be prevented, and an inorganic EL element can be reliably sealed.

SUMMARY

An EL display device (organic EL display device 100, 200) according to a first aspect of the present invention includes an EL element (organic EL element 20) formed on a substrate (base 1), and a sealing film (30) formed on the substrate and the EL element so as to seal the EL element between the sealing film and the substrate. The sealing film includes a first inorganic film (lower inorganic film 31). The first inorganic film has a multilayer structure including a first layer (first inorganic layer 34) and a second layer (second inorganic layer 35). The first layer is in contact with the substrate and the EL element. The second layer is formed on the first layer. An absolute value of a film stress of the first layer is less than an absolute value of a film stress of the second layer, and a film thickness of the first layer is less than a film thickness of the second layer.

According to the above-described structure, since the first inorganic film includes the first layer, the adhesion of the first inorganic film to the substrate and the EL element can be increased. In addition, since the first inorganic film includes the second layer, the elongation at break of the first inorganic film can be increased.

Thus, the adhesion between the first inorganic film and the EL element and the elongation at break of the first inorganic film can both be increased.

According to a second aspect of the present invention, in the EL display device according to the first aspect, the sealing film may include an organic film (32) provided on the first inorganic film and a second inorganic film (upper inorganic film 33) provided on the organic film.

According to the above-described structure, since the organic film is provided, the stress of the first inorganic film can be absorbed. In addition, since the second inorganic film is provided, the moisture resistance can be increased.

According to a third aspect of the present invention, in the EL display device according to the second aspect, the second inorganic film may have a multilayer structure including a third layer (third inorganic layer 36) and a fourth layer (fourth inorganic layer 37). The third layer is in contact with the organic film. The fourth layer is formed on the third layer. An absolute value of a film stress of the third layer is less than an absolute value of a film stress of the fourth layer, and a film thickness of the third layer is less than a film thickness of the fourth layer.

According to the above-described structure, since the second inorganic film includes the third layer, the adhesion between the second inorganic film and the organic film can be increased. In addition, since the second inorganic film includes the fourth layer, the elongation at break of the second inorganic film can be increased.

Thus, the adhesion between the second inorganic film and the organic film and the elongation at break of the second inorganic film can both be increased.

According to a fourth aspect of the present invention, in the EL display device according to any one of the first to third aspects, the film thickness of the first layer may be greater than or equal to 100 nm and less than 200 nm, and a compressive stress of the first layer may be greater than or equal to −100 MPa and less than 0 MPa. In addition, the film thickness of the second layer may be greater than or equal to 200 nm and less than or equal to 300 nm, and a compressive stress of the second layer may be greater than or equal to −300 MPa and less than −100 MPa.

According to the above-described structure, the moisture resistance and the elongation at break of the sealing film can both be increased.

According to a fifth aspect of the present invention, the EL display device according to any one of the first to fourth aspects may include a counter substrate arranged so as to face the substrate. A space between the substrate provided with the EL element and the sealing film and the counter substrate may be filled with a filler (7), and a multilayer end surface of the sealing film may be covered with the filler.

According to the above-described structure, since the multilayer end surface of the sealing film is covered with the filler, the risk that moisture and oxygen will enter along the boundaries between the layers of the sealing film can be reduced. Accordingly, the risk that moisture and oxygen will enter the EL element can be reduced.

According to a sixth aspect of the present invention, in the EL display device according to the second aspect, the second inorganic film may be configured to cover a top surface and an end surface of the organic film.

Organic films have a lower moisture resistance than inorganic films. However, according to the above-described structure, the surfaces (top and end surfaces) of the organic film are covered with the second inorganic film, and therefore the surfaces of the organic film are not exposed. Accordingly, the risk that moisture and oxygen will enter the EL element from the surfaces of the organic film can be reduced.

According to a seventh aspect of the present invention, in the EL display device according to the sixth aspect, the second inorganic film may be configured to cover a multilayer end surface of the first inorganic film and the organic film.

According to the above-described structure, the risk that moisture and oxygen will enter the EL element along the boundary between the organic film and the first inorganic film can be reduced.

According to an eighth aspect of the present invention, in the EL display device according to the sixth aspect, the organic film may be configured to cover a top surface and an end surface of the first inorganic film, and the second inorganic film may be configured to cover the top surface and the end surface of the organic film.

According to the above-described structure, among the films that constitute the sealing film, the surfaces of the first inorganic film, which is closest to the EL element, are covered with both the organic film and the second inorganic film. Therefore, the risk that moisture and oxygen will reach the first inorganic film can be reduced. As a result, the risk that moisture and oxygen will enter the EL element can be reduced.

According to a ninth aspect of the present invention, in the EL display device according to the sixth aspect, the organic film may be configured to cover a portion of the top surface of the first inorganic film, and the second inorganic film may be configured to cover the top surface and the end surface of the organic film and the top surface of the first inorganic film.

According to a tenth aspect of the present invention, a method for manufacturing an EL display device including an EL element formed on a substrate and a sealing film formed on the substrate and the EL element so as to seal the EL element between the sealing film and the substrate, the sealing film including a first inorganic film, includes forming the first inorganic film. The first inorganic film has a multilayer structure including a first layer and a second layer. The first layer is in contact with the substrate and the EL element. The second layer is formed on the first layer. In the forming, the first inorganic film is formed so that an absolute value of a film stress of the first layer is less than an absolute value of a film stress of the second layer, and that a film thickness of the first layer is less than a film thickness of the second layer.

According to the above-described manufacturing method, by forming the first inorganic film including the first layer and the second layer, an EL display device including a sealing film in which the adhesion of the first inorganic film to the substrate and the EL element is increased and in which the elongation at break of the first inorganic film is also increased can be manufactured.

According to an eleventh aspect of the present invention, in the method for manufacturing the EL display device according to the tenth aspect, in the forming, the sealing film may be formed by plasma CVD.

Since plasma CVD provides good step coverage, according to the above-described manufacturing method, the sealing film can be formed evenly over the surface of the substrate even when the surface of the substrate has projections and recesses.

The present invention is not limited to the above-described embodiments, and various modifications are possible within the scope of the claims. An embodiment obtained by appropriately combining technical means disclosed in different embodiments is also included in the technical scope of the present invention. Also, a new technical feature may be obtained by combining technical means disclosed in the embodiments.

INDUSTRIAL APPLICABILITY

The present invention is suitably applicable to formation of a sealing film that covers an EL element in an EL display device.

REFERENCE SIGNS LIST 7 filler
10 TFT substrate
20 organic EL element
30, 130, 230 sealing film
31, 131, 231 lower inorganic film (first inorganic film)
32 organic film
33, 133, 233 upper inorganic film (second inorganic film)
34 first inorganic layer (first layer)
35 second inorganic layer (second layer)
50 counter substrate
100, 200 organic EL display device (EL display device)

The invention claimed is:

1. An EL display device comprising:
an EL element formed on a substrate; and
a sealing film formed on the substrate and the EL element so as to seal the EL element between the sealing film and the substrate,
wherein the sealing film includes a first inorganic film,
wherein the first inorganic film comprises a multilayer structure including a first layer and a second layer, the first layer being in contact with the substrate and the EL element, the second layer being formed on the first layer,
wherein an absolute value of a film stress of the first layer is less than an absolute value of a film stress of the second layer, and a film thickness of the first layer is less than a film thickness of the second layer,
wherein the sealing film includes an organic film provided on the first inorganic film and a second inorganic film provided on the organic film,
wherein the second inorganic film comprises a multilayer structure including a third layer and a fourth layer, the third layer being in contact with the organic film, the fourth layer being formed on the third layer, and
wherein an absolute value of a film stress of the third layer is less than an absolute value of a film stress of the fourth layer, and a film thickness of the third layer is less than a film thickness of the fourth layer.

2. The EL display device according to claim 1, wherein the film thickness of the first layer is greater than or equal to 100 nm and less than 200 nm, and a compressive stress of the first layer is greater than or equal to −100 MPa and less than 0 MPa, and
wherein the film thickness of the second layer is greater than or equal to 200 nm and less than or equal to 300 nm, and a compressive stress of the second layer is greater than or equal to −300 MPa and less than −100 MPa.

3. The EL display device according to claim 1, comprising a counter substrate arranged so as to face the substrate,
wherein a space between the substrate provided with the EL element and the sealing film and the counter substrate is filled with a filler, and
wherein a multilayer end surface of the sealing film is covered with the filler.

4. The EL display device according to claim 1, wherein the second inorganic film is configured to cover a top surface and an end surface of the organic film.

5. The EL display device according to claim 4, wherein the second inorganic film is configured to cover a multilayer end surface of the first inorganic film and the organic film.

6. The EL display device according to claim 4, wherein the organic film is configured to cover a top surface and an end surface of the first inorganic film, and
wherein the second inorganic film is configured to cover the top surface and the end surface of the organic film.

7. The EL display device according to claim 4, wherein the organic film is configured to cover a portion of a top surface of the first inorganic film, and
wherein the second inorganic film is configured to cover the top surface and the end surface of the organic film and the top surface of the first inorganic film.

8. An EL display device comprising:
an EL element formed on a substrate; and
a sealing film formed on the substrate and the EL element so as to seal the EL element between the sealing film and the substrate,
wherein the sealing film includes a first inorganic film, wherein the first inorganic film comprises a multilayer structure including a first layer and a second layer, the first layer being in contact with the substrate and the EL element, the second layer being formed on the first layer, wherein an absolute value of a film stress of the first layer is less than an absolute value of a film stress of the second layer, and a film thickness of the first layer is less than a film thickness of the second layer, wherein the film thickness of the first layer is greater than or equal to 100 nm and less than 200 nm, and a compressive stress of the first layer is greater than or equal to −100 MPa and less than 0 MPa, and wherein the film thickness of the second layer is greater than or equal to 200 nm and less than or equal to 300 nm, and a compressive stress of the second layer is greater than or equal to −300 MPa and less than −100 MPa.

9. The EL display device according to claim 8, wherein the sealing film includes an organic film provided on the first inorganic film and a second inorganic film provided on the organic film.

10. The EL display device according to claim 8, comprising a counter substrate arranged so as to face the substrate, wherein a space between the substrate provided with the EL element and the sealing film and the counter substrate is filled with a filler, and wherein a multilayer end surface of the sealing film is covered with the filler.

11. The EL display device according to claim 9, wherein the second inorganic film is configured to cover a top surface and an end surface of the organic film.

12. The EL display device according to claim 11, wherein the second inorganic film is configured to cover a multilayer end surface of the first inorganic film and the organic film.

13. The EL display device according to claim 11, wherein the organic film is configured to cover a top surface and an end surface of the first inorganic film, and wherein the second inorganic film is configured to cover the top surface and the end surface of the organic film.

14. The EL display device according to claim 11, wherein the organic film is configured to cover a portion of a top surface of the first inorganic film, and wherein the second inorganic film is configured to cover the top surface and the end surface of the organic film and the top surface of the first inorganic film.

* * * * *